United States Patent
Kim et al.

(10) Patent No.: US 10,510,534 B2
(45) Date of Patent: Dec. 17, 2019

(54) THIN FILM, METHOD OF FABRICATING THE SAME, AND APPARATUS FOR FABRICATING THE SAME

(71) Applicant: IUCF-HYU (INDUSTRY-UNIVERSITY COOPERATION FOUNDATION HANYANG UNIVERSITY), Seoul (KR)

(72) Inventors: Eunkyu Kim, Seoul (KR); Changsoo Park, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 15/700,691

(22) Filed: Sep. 11, 2017

(65) Prior Publication Data

US 2018/0025909 A1    Jan. 25, 2018

Related U.S. Application Data

(63) Continuation of application No. PCT/KR2016/000768, filed on Jan. 25, 2016.

(30) Foreign Application Priority Data

Mar. 9, 2015   (KR) .................. 10-2015-0032615
Apr. 7, 2015   (KR) .................. 10-2015-0049020

(51) Int. Cl.
*H01L 29/16*   (2006.01)
*H01L 21/02*   (2006.01)
(Continued)

(52) U.S. Cl.
CPC ...... *H01L 21/02527* (2013.01); *C01B 32/186* (2017.08); *C23C 16/26* (2013.01);
(Continued)

(58) Field of Classification Search
CPC ......... H01L 21/02; H01L 21/28; H01L 29/16; H01L 21/20
(Continued)

(56) References Cited

U.S. PATENT DOCUMENTS 6,664,728 B2 * 12/2003 Pavlovsky ............. B82Y 10/00
                                              313/310
8,507,797 B2    8/2013 Veerasamy
(Continued)

FOREIGN PATENT DOCUMENTS

CN    103265019 A  *  8/2013
JP    2002-338220 A    11/2002
KR    10-2014-0032266 A    3/2014

OTHER PUBLICATIONS

English translation of JP-2015024937-A, Feb. 2015.*
(Continued)

*Primary Examiner* — Sheikh Maruf
(74) *Attorney, Agent, or Firm* — Sughrue Mion, PLLC

(57) ABSTRACT

An apparatus for fabricating a thin film is provided. The apparatus includes a tube including one end and another end, a first heater supplying heat to a first region, adjacent to the one end, of the tube, a second heater supplying heat to a second region, adjacent to the another end, of the tube and disposed in parallel to the first heater along the tube, a gas inlet through which a source gas is supplied to the one end of the tube, and a gas outlet through which the source gas is exhausted from the another end of the tube.

12 Claims, 9 Drawing Sheets

(51) Int. Cl.
  *C01B 32/186* (2017.01)
  *C23C 16/26* (2006.01)
(52) U.S. Cl.
  CPC .... *H01L 21/0262* (2013.01); *H01L 21/02579* (2013.01); *H01L 29/1606* (2013.01)
(58) Field of Classification Search
  USPC ........................................................ 438/384
  See application file for complete search history.

(56) References Cited

U.S. PATENT DOCUMENTS

| | | | | |
|---|---|---|---|---|
| 9,870,925 | B1* | 1/2018 | Feygenson | H01L 21/223 |
| 2003/0164143 | A1* | 9/2003 | Toyoda | C23C 16/452 |
| | | | | 118/723 E |
| 2003/0175462 | A1* | 9/2003 | Nishino | B82Y 30/00 |
| | | | | 428/36.91 |
| 2005/0042160 | A1* | 2/2005 | Nishino | B82Y 30/00 |
| | | | | 423/342 |
| 2005/0082557 | A1* | 4/2005 | Seong | H01L 21/28575 |
| | | | | 257/96 |
| 2008/0066856 | A1* | 3/2008 | Yamazaki | H01L 21/6836 |
| | | | | 156/285 |
| 2008/0166491 | A1* | 7/2008 | Watanabe | C23C 18/02 |
| | | | | 427/427.7 |
| 2009/0008648 | A1* | 1/2009 | Biwa | H01L 33/025 |
| | | | | 257/76 |
| 2009/0201960 | A1* | 8/2009 | Numata | B82Y 20/00 |
| | | | | 372/43.01 |
| 2010/0051897 | A1* | 3/2010 | Chen | B82Y 10/00 |
| | | | | 257/9 |
| 2010/0102292 | A1* | 4/2010 | Hiura | B82Y 10/00 |
| | | | | 257/9 |
| 2011/0030991 | A1* | 2/2011 | Veerasamy | C30B 29/02 |
| | | | | 174/126.1 |
| 2011/0186806 | A1* | 8/2011 | Bowers | H01L 21/22 |
| | | | | 257/9 |
| 2012/0031330 | A1* | 2/2012 | Tsumori | C30B 25/12 |
| | | | | 118/708 |
| 2012/0032209 | A1* | 2/2012 | Shioda | H01L 33/04 |
| | | | | 257/94 |
| 2012/0048180 | A1* | 3/2012 | Ito | C23C 16/325 |
| | | | | 117/88 |
| 2012/0146187 | A1* | 6/2012 | Anderson | H01L 23/5228 |
| | | | | 257/538 |
| 2012/0184080 | A1* | 7/2012 | Lukaitis | H01L 27/1203 |
| | | | | 438/384 |
| 2013/0313522 | A1* | 11/2013 | Nourbakhsh | H01L 29/1606 |
| | | | | 257/29 |
| 2014/0045342 | A1* | 2/2014 | Mallick | H01L 21/0226 |
| | | | | 438/778 |
| 2014/0218867 | A1* | 8/2014 | Kim | H05K 9/0088 |
| | | | | 361/704 |
| 2014/0264384 | A1* | 9/2014 | Loboda | H01L 21/02529 |
| | | | | 257/77 |
| 2016/0071838 | A1* | 3/2016 | McMullan | H01L 28/24 |
| | | | | 438/384 |
| 2016/0133462 | A1* | 5/2016 | Jarvis | C23C 16/50 |
| | | | | 438/509 |
| 2016/0133928 | A1* | 5/2016 | Nemeth | H01M 10/052 |
| | | | | 429/213 |
| 2016/0254144 | A1* | 9/2016 | Gambino | H01L 21/02266 |
| | | | | 438/384 |
| 2017/0130336 | A1* | 5/2017 | Fujikura | C23C 16/44 |
| 2017/0263475 | A1* | 9/2017 | Locquet | C23C 14/228 |
| 2017/0292188 | A1* | 10/2017 | Nakada | H01L 21/205 |
| 2017/0321346 | A1* | 11/2017 | Harashima | C30B 25/10 |
| 2017/0345658 | A1* | 11/2017 | Fukada | C30B 25/14 |
| 2017/0372902 | A1* | 12/2017 | Dassel | H01L 29/04 |

OTHER PUBLICATIONS

English translation of CN-103265019-A, Aug. 2013.*
Z.M Ao et al., "Enhancement of CO detection in Al doped graphene", Chemical Physics Letters, 2008, pp. 276-279, vol. 461.
Marcella Giovanni et al., "Noble metal (Pd, Ru, Rh, Pt, Au, Ag) doped graphene hybrids for electrocatalysis", Nanoscale, 2012, pp. 5002-5008, vol. 4.
K.S. Subrahmanyam et al., "A study of graphene decorated with metal nanoparticles", Chemical Physics Letter, 2010, pp. 70-75, No. 497.
International Search Report for PCT/KR2016/000768 dated Apr. 29, 2016.

* cited by examiner

[Fig. 1]
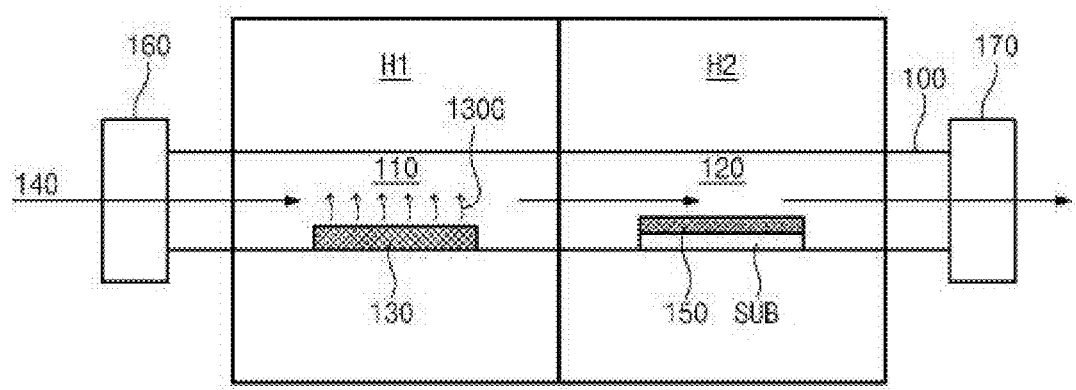

[Fig. 2]
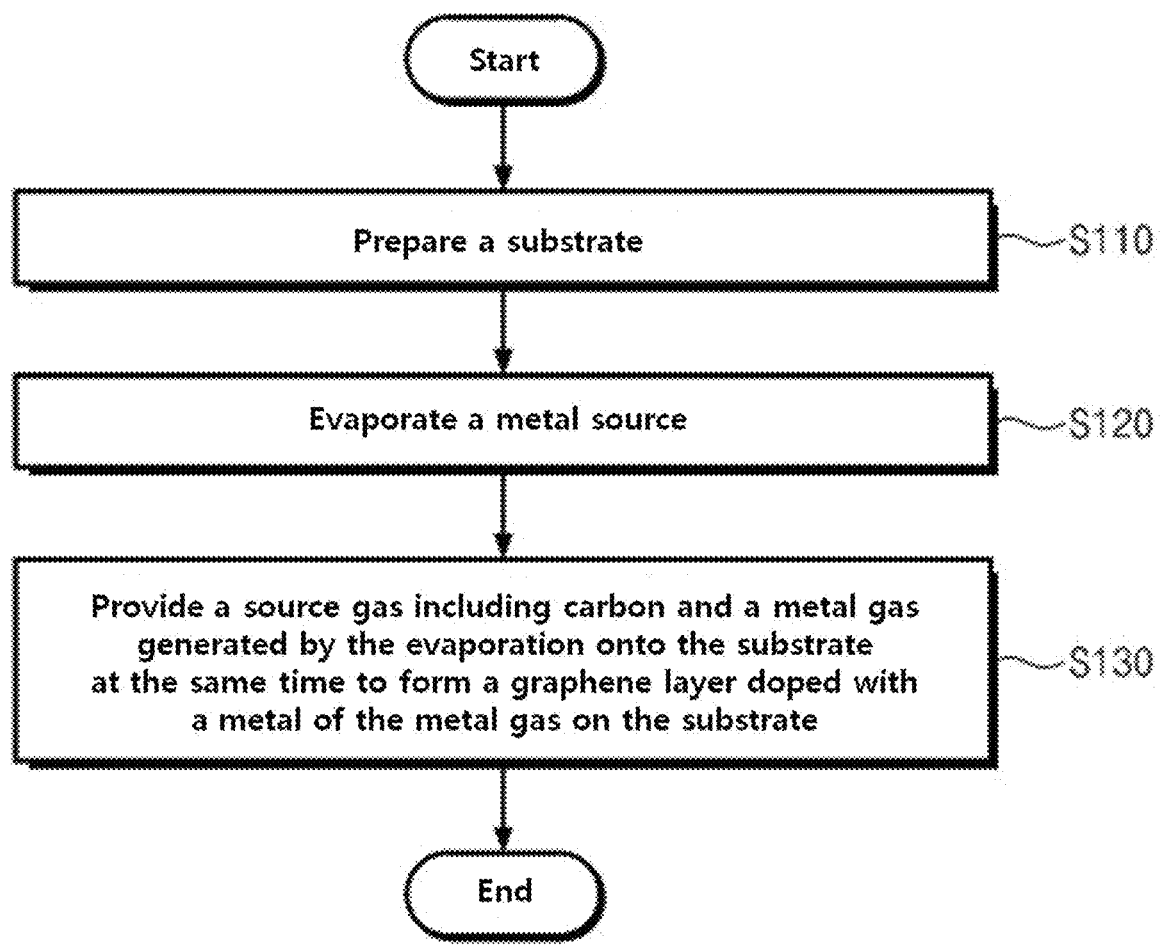

[Fig. 3]
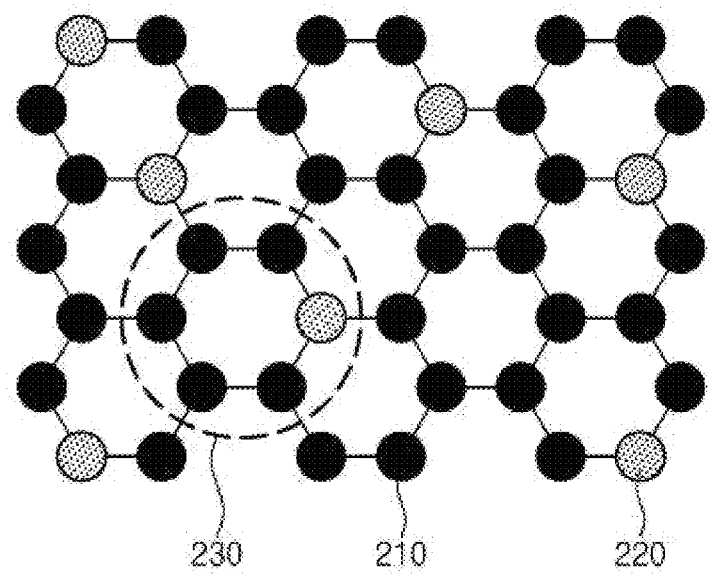

[Fig. 4]
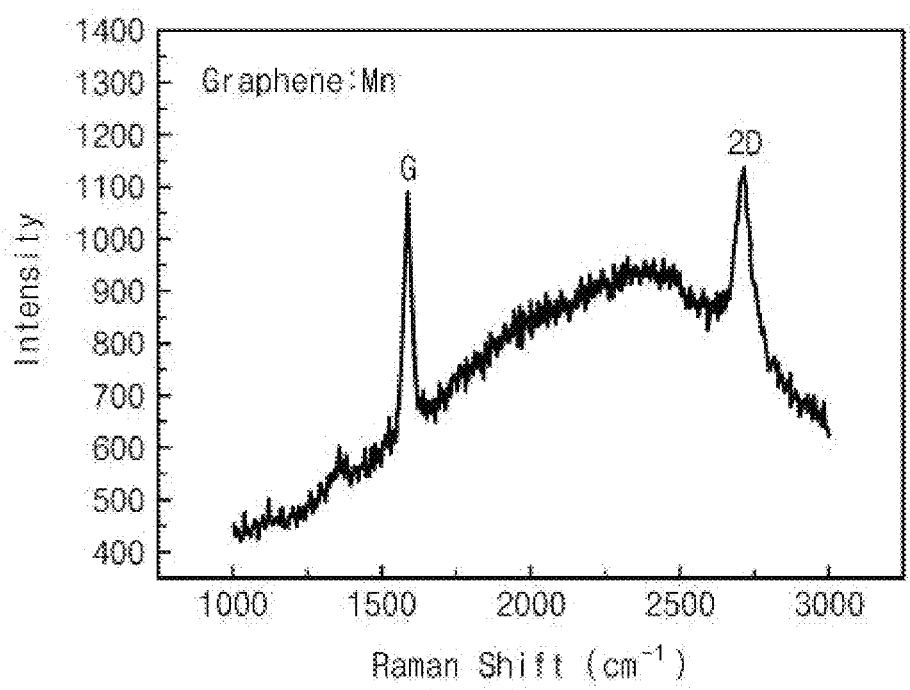

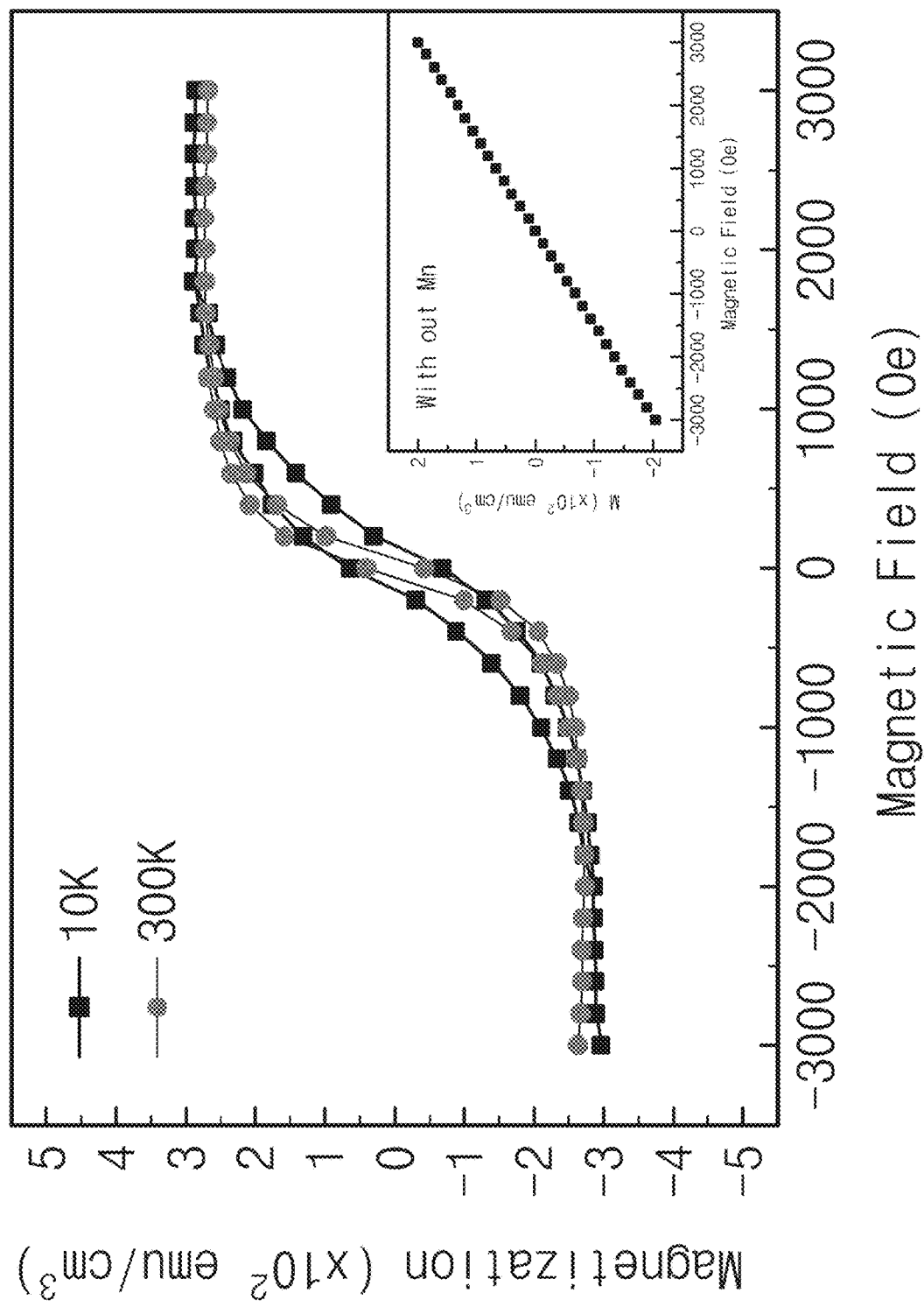
[Fig. 5]

[Fig. 6]
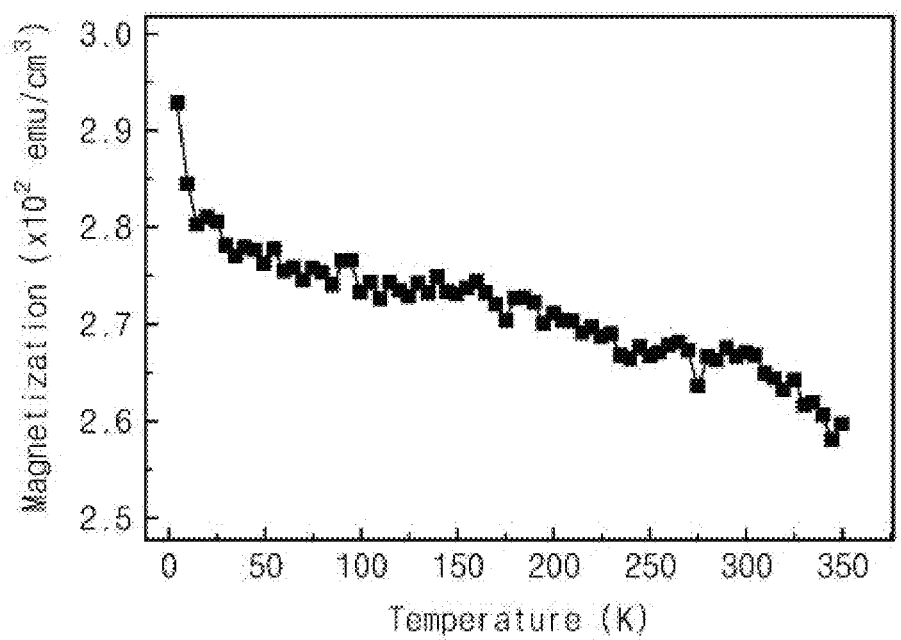

[Fig. 7]
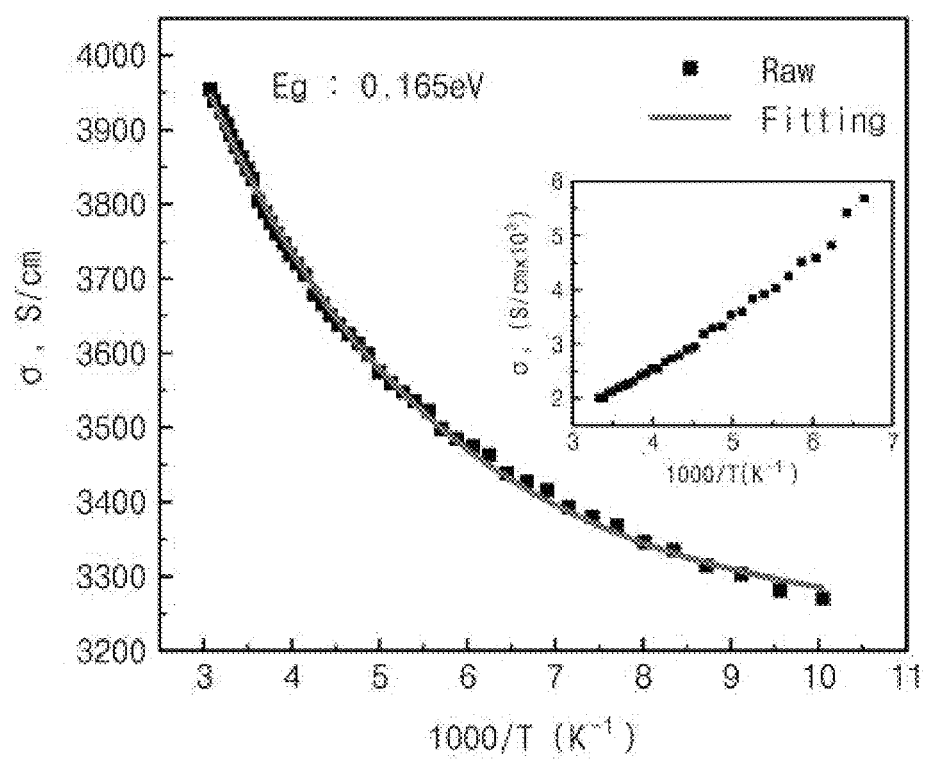

[Fig. 8]
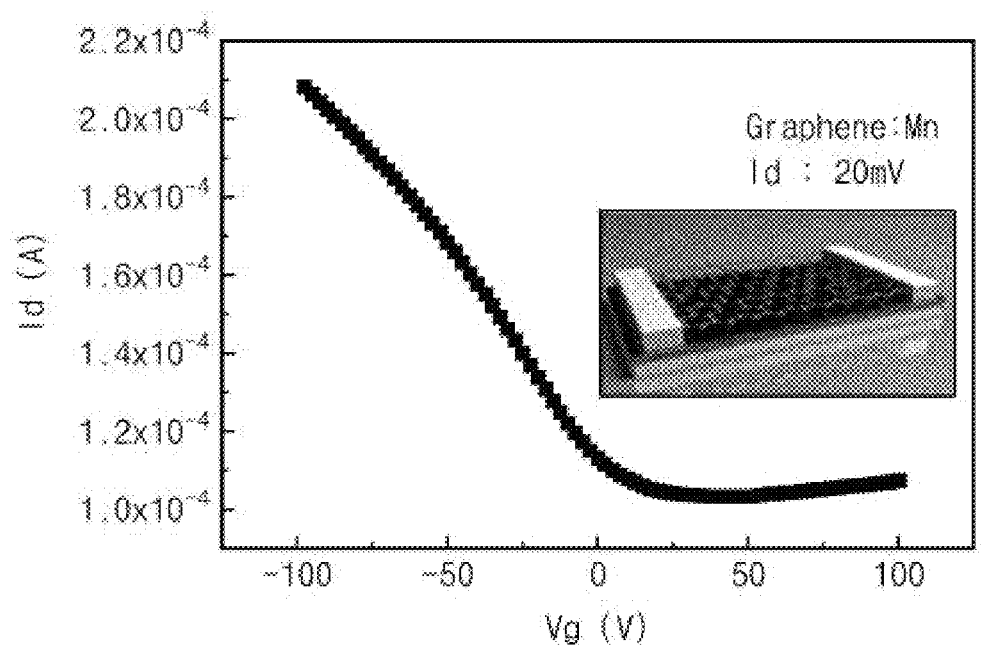

[Fig. 9]
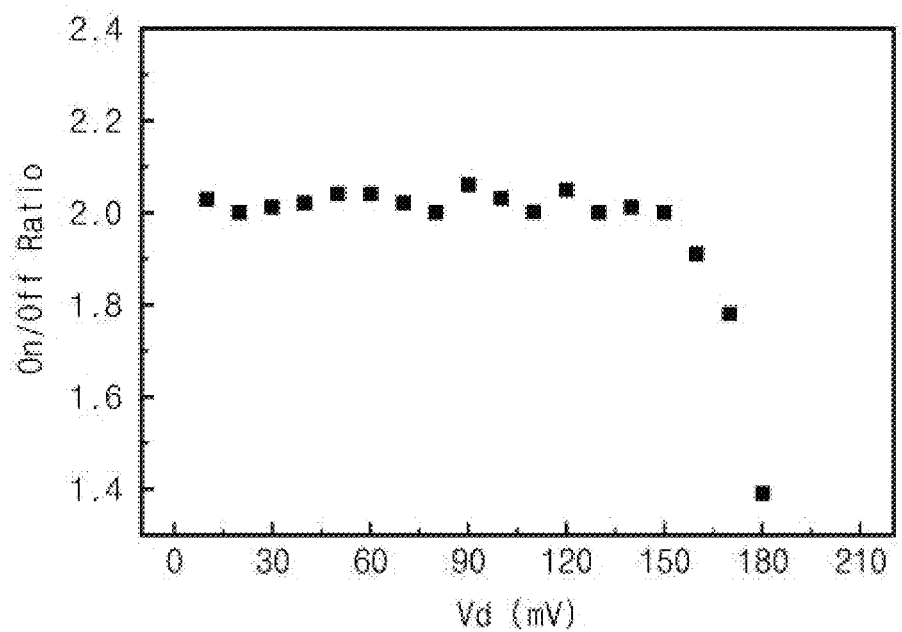

THIN FILM, METHOD OF FABRICATING THE SAME, AND APPARATUS FOR FABRICATING THE SAME

CROSS-REFERENCE TO RELATED APPLICATION

This application is a continuation of pending International Application No. PCT/KR2016/000768, which was filed on Jan. 25, 2016 and claims priority to Korean Patent Application Nos. 10-2015-0032615 and 10-2015-0049020, filed on Mar. 9, 2015 and Apr. 7, 2015, in the Korean Intellectual Property Office, the disclosures of which are hereby incorporated by reference in their entireties.

BACKGROUND

1. Field

Embodiments of the inventive concepts relate to a thin film, a method of fabricating the same, and an apparatus for fabricating the same. More particularly, embodiments of the inventive concepts relate to a thin film doped with a metal, a method of fabricating the same, and an apparatus for fabricating the same.

2. Description of the Related Art

Graphene is a two-dimensional material formed of carbon atoms and has a honeycomb structure. Single-layered graphene is a material having a very thin thickness of 3 Å and has semi-metallic properties.

The graphene is structurally and chemically very stable and has excellent electrical characteristics by its quantum mechanical property. Electrons moving in the graphene may be about 100 times or more faster than electrons moving in single-crystalline silicon, and the amount of a current flowing through the graphene may be about 100 times more than the amount of a current flowing through copper. Due to these characteristics, the graphene is spotlighted as the next-generation material that will be substituted for a conventional material.

The graphene may be applied to various technical fields such as a transparent electrode, a transparent display, a secondary electrode material, and a memory device. Thus, various research and development are underway to control and/or improve electrical, physical, chemical and mechanical characteristics of the graphene in accordance with the technical field to which the graphene is applied.

For example, Korean Patent Publication No. 10-2010-0103124 (Application No. 10-2009-0021574, Applicant: Korea Research Institute of Standards and Science) discloses a technique in which structural defects are generated in graphene by oxygen plasma to control electrical characteristics of the graphene without changing a whole shape of the graphene.

SUMMARY

Embodiments of the inventive concepts may provide a thin film including a graphene layer doped with a metal, a method of fabricating the same, and an apparatus for fabricating the same.

Embodiments of the inventive concepts may also provide a thin film including a graphene layer having magnetic properties, a method of fabricating the same, and an apparatus for fabricating the same.

Embodiments of the inventive concepts may further provide a thin film including a graphene layer having a band gap, a method of fabricating the same, and an apparatus for fabricating the same.

Embodiments of the inventive concepts may further provide a thin film fabricated by performing a doping process of a metal and a synthesis process of graphene at the same time, a method of fabricating the same, and an apparatus for fabricating the same.

In an aspect, an apparatus for fabricating a thin film may include a tube including one end and another end, a first heater supplying heat to a first region, adjacent to the one end, of the tube, a second heater supplying heat to a second region, adjacent to the another end, of the tube and disposed in parallel to the first heater along the tube, a gas inlet through which a source gas is supplied to the one end of the tube, and a gas outlet through which the source gas is exhausted from the another end of the tube.

In some embodiments, a metal source may be disposed in the first region and may be evaporated by the heat supplied from the first heater to generate a metal gas. A substrate may be disposed in the second region, and the generated metal gas and the source gas may be provided onto the substrate at the same time to form a thin film doped with a metal of the metal gas on the substrate.

In some embodiments, the source gas may include carbon, and a graphene layer doped with the metal may be formed on the substrate.

In some embodiments, the metal source may include a transition metal oxide.

In some embodiments, an internal temperature of the first region and an internal temperature of the second region may be adjusted independently of each other by the first heater and the second heater.

In some embodiments, the first heater and the second heater may surround the first region and the second region, respectively.

In another aspect, a method of fabricating a thin film may include preparing a substrate, evaporating a metal source to generate a metal gas, and forming a graphene layer doped with a metal of the metal gas on the substrate by providing a source gas including carbon and the metal gas onto the substrate at the same time.

In some embodiments, the metal may be covalently bonded to carbons included in the graphene layer to form a honeycomb lattice.

In some embodiments, the evaporating of the metal source and the forming of the graphene layer doped with the metal may be performed in the same tube.

In some embodiments, the evaporating of the metal source may include supplying heat to the metal source, and a doping concentration of the metal may be adjusted by adjusting the heat supplied to the metal source.

In still another aspect, a thin film may include a graphene layer doped with a metal that is covalently bonded to carbons to form a honeycomb lattice.

In some embodiments, a resistance of the graphene layer doped with the metal may decrease as a temperature increases.

In some embodiments, the graphene layer doped with the metal may have a ferromagnetic property at room temperature.

BRIEF DESCRIPTION OF THE DRAWINGS

FIG. 1 is a schematic view illustrating an apparatus for fabricating a thin film, according to some embodiments of the inventive concepts.

FIG. 2 is a flowchart illustrating a method of fabricating a thin film, according to some embodiments of the inventive concepts.

FIG. 3 is a schematic view illustrating a thin film according to some embodiments of the inventive concepts.

FIG. 4 is a graph illustrating a Raman spectrum of a thin film according to some embodiments of the inventive concepts.

FIG. 5 is a graph illustrating a change in magnetization according to a magnetic field of a thin film according to some embodiments of the inventive concepts.

FIG. 6 is a graph illustrating a change in magnetization according to a temperature of a thin film according to some embodiments of the inventive concepts.

FIG. 7 is a graph illustrating a change in resistance according to a temperature of a thin film according to some embodiments of the inventive concepts.

FIG. 8 is a graph illustrating a current-voltage characteristic of a transistor including a thin film according to some embodiments of the inventive concepts.

FIG. 9 is a graph illustrating an on/off current ratio of a transistor including a thin film according to some embodiments of the inventive concepts.

DETAILED DESCRIPTION OF THE EMBODIMENTS

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

A thin film, a method of fabricating the same and an apparatus for fabricating the same according to some embodiments of the inventive concepts will be described with reference to FIGS. 1 to 3.

FIG. 1 is a schematic view illustrating an apparatus for fabricating a thin film, according to some embodiments of the inventive concepts, FIG. 2 is a flowchart illustrating a method of fabricating a thin film, according to some embodiments of the inventive concepts, and FIG. 3 is a schematic view illustrating a thin film according to some embodiments of the inventive concepts.

Referring to FIGS. 1 and 2, an apparatus for fabricating a thin film (hereinafter, referred to as 'a thin film fabricating apparatus') according to some embodiments may include a tube 100, a first heater H1, a second heater H2, a gas inlet 160, and a gas outlet 170.

The tube 100 may include one end and another end. The tube 100 may have a line shape extending in one direction. In some embodiments, the tube 100 may be a quartz tube.

The tube 100 may include a first region 110 and a second region 120. The first region 110 may be adjacent to the one end of the tube 100, and the second region 120 may be adjacent to the another end of the tube 100.

The first heater H1 may surround the first region 110 of the tube 100. In other words, a region of the tube 100, which is surrounded by the first heater H1, may be defined as the first region 110. The first heater H1 may supply heat to the first region 110.

The second heater H2 may surround the second region 120 of the tube 100. In other words, a region of the tube 100, which is surrounded by the second heater H2, may be defined as the second region 120. The second heater H2 may supply heat to the second region 120.

The first heater H1 and the second heater H2 may be operated independently of each other. In other words, an internal temperature of the first region 110 and an internal temperature of the second region 120 may be adjusted independently of each other by the heat supplied from the first heater H1 and the heat supplied from the second heater H2.

The gas inlet 160 may be disposed at the one end of the tube 100, and the gas outlet 170 may be disposed at the another end of the tube 100. Thus, the gas inlet 160, the first region 110, the second region 120, and the gas outlet 170 may be sequentially arranged in the one direction.

A metal source 130 may be disposed in the first region 110 of the tube 100. According to an embodiment, the metal source 130 may include a transition metal oxide. For example, the metal source 130 may include molybdenum oxide, titanium oxide, cobalt oxide, nickel oxide, or tungsten oxide.

A substrate SUB may be prepared in the second region 120 of the tube 100 (S110). According to an embodiment, the substrate SUB may be a copper film. Alternatively, according to other embodiments, the substrate SUB may be a silicon semiconductor substrate, a compound semiconductor substrate, a glass substrate, a plastic substrate, or a metal substrate.

The metal source 130 in the first region 110 may be evaporated by the heat supplied from the first heater H1 to the first region 110 (S120). In addition, a source gas 140 may be supplied from the gas inlet 160 to the one end of the tube 100. In an embodiment, the source gas 140 may include a methane ($CH_4$) gas, a hydrogen ($H_2$) gas, and a carrier gas.

A metal gas 130G generated by evaporating the metal source 130 in the first region 110 by the first heater H1 may be moved into the second region 120 along with the source gas 140, and the metal gas 130G and the source gas 140 may be provided onto the substrate SUB disposed in the second region 120 to form a thin film 150 doped with the metal of the metal gas 130G on the substrate SUB (S130). In other words, the metal gas 130G and the source gas 140 may be provided onto the substrate SUB at the same time to form the thin film 150 doped with the metal on the substrate SUB.

When the source gas 140 includes carbon (e.g., the $CH_4$ gas), a graphene layer doped with the metal may be formed on the substrate SUB. In other words, the graphene layer may be synthesized and doped with the metal at the same time.

After the formation of the thin film 150 doped with the metal, a remaining source gas 140 and a remaining metal gas 130G may be exhausted to the outside of the tube 100 through the gas outlet 170.

According to some embodiments of the inventive concepts, the metal source 130 and the substrate SUB may be disposed in the first region 110 and the second region 120 of the tube 100, respectively, and the process of generating the metal gas 130G by evaporating the metal source 130 and the process of forming the thin film 150 doped with the metal (e.g., the graphene layer doped with the metal) on the substrate SUB may be performed in the same tube 100. Thus, it is possible to provide the method and the apparatus of fabricating the thin film, which simplify fabricating processes and reduce a fabrication cost.

In addition, as described above, the source gas 140 including carbon and the metal gas 130G generated by the evaporation may be provided onto the substrate SUB at the same time to form the graphene layer doped with the metal on the substrate SUB. Thus, as illustrated in FIG. 3, the metal 220 in the graphene layer doped with the metal may be covalently bonded to carbons 210 in the graphene to constitute a honeycomb lattice 230. As a result, electrical and magnetic characteristics of the graphene layer doped with the metal can be improved. For example, in the event that the metal is molybdenum and a graphene layer doped with molybdenum is formed on the substrate SUB, the graphene layer doped with molybdenum may have a ferromagnetic property at room temperature and may have a semiconductor property in which a resistance decreases as a temperature increases.

If a graphene layer is doped with a metal after formation of the graphene layer unlike the above embodiment of the inventive concepts, the metal may not form a honeycomb lattice with carbons of the graphene layer but may be adsorbed on a surface of the graphene layer. Thus, it is not easy to adjust electrical and magnetic characteristics of the graphene layer by doping of the metal.

However, according to the aforementioned embodiment of the inventive concepts, the source gas 140 including carbon and the metal gas 130G generated by the evaporation may be provided onto the substrate SUB at the same time to perform the synthesis of the graphene layer and the doping of the metal at the same time. Thus, the graphene layer doped with the metal covalently bonded to carbons to constitute the honeycomb lattice may be formed on the substrate SUB to easily improve the electrical and magnetic characteristics of the graphene layer.

In addition, according to some embodiments of the inventive concepts, a doping concentration of the metal may be adjusted by adjusting the heat supplied from the first heater H1 to the metal source 130. For example, the doping concentration of the metal may increase as the heat supplied from the first heater H1 increases. As a result, it is possible to provide the thin film, the method of fabricating the same, and the apparatus for fabricating the same, which can easily adjust the electrical and magnetic characteristics.

Furthermore, according to some embodiments of the inventive concepts, the first heater H1 supplying heat into the first region 110 to evaporate the metal source 130 may be operated independently of the second heater H2 supplying heat into the second region 120. Thus, the inside of the first region 110 may have a temperature at which the metal source 130 is easily evaporated, and the inside of the second region 120 may have a temperature at which the thin film 150 doped with the metal (e.g., the graphene layer doped with the metal) is easily deposited. As a result, an evaporation efficiency of the metal source 130 and a deposition efficiency of the thin film 150 doped with the metal may be improved to provide a highly reliable thin film of which a fabrication cost is reduced, the method of fabricating the same, and the apparatus for fabricating the same.

Evaluation results of characteristics of the thin film fabricated according to the aforementioned embodiment of the inventive concepts will be described hereinafter.

Fabrication of Graphene Layer Doped with Manganese According to Embodiment of the Inventive Concept A thin film fabricating apparatus having a first heater and a second heater was prepared. The first heater surrounds a first region of a quartz tube, and the second heater surrounds a second region of the quartz tube. Manganese oxide powder was disposed in the first region, and a copper film having a thickness of 25 μm was disposed in the second region. Thereafter, a temperature of the first region was raised to 1000° C. for 40 minutes, and a hydrogen gas of 20 sccm and an argon gas of 1000 sccm were supplied into the first region for 30 minutes while maintaining the temperature of the first region at 1000° C. After evaporation of manganese oxide was started, a hydrogen gas of 20 sccm and a methane gas of 3 sccm were supplied for 10 minutes to deposit a graphene layer doped with manganese on the copper film, and then, the temperature was lowered from 1000° C. to 50° C. for 30 minutes.

Thereafter, the graphene layer doped with manganese was transferred to poly(methyl methacrylate) (PMMA) and then was finally transferred to a P-type silicon substrate which has silicon oxide having a thickness of 300 nm.

Analysis of Results of Raman Spectrum

FIG. 4 is a graph illustrating a Raman spectrum of a thin film according to some embodiments of the inventive concepts.

Referring to FIG. 4, Raman spectrum was measured for the graphene layer doped with manganese, fabricated by the method described above. As a result, a G peak was observed at 1,569 $cm^{-1}$, and a 2D peak was observed at 2,702 $cm^{-1}$. Intensities of the G peak and the 2D peak were substantially similar to each other, and a full width at half-maximum of the 2D peak was 60 or less. Thus, it may be recognized that the graphene layer doped with manganese is formed of a bilayer.

Measurement and Analysis of Magnetization

FIG. 5 is a graph illustrating a change in magnetization according to a magnetic field of a thin film according to some embodiments of the inventive concepts.

Referring to FIG. 5, a magnetization according to a magnetic field of the graphene layer doped with manganese fabricated by the above method were measured at absolute temperatures of 10K and 300K. As shown in FIG. 5, at the condition of 10K, a coercive field value was 188 Oe and a remanent magnetization value was 102 emu/cm$^3$. A graphene layer not doped with manganese does not have ferromagnetic hysteresis at room temperature (see an inner graph of FIG. 5), but the graphene layer doped with manganese according to the inventive concepts has the ferromagnetic hysteresis at the room temperature.

FIG. 6 is a graph illustrating a change in magnetization according to a temperature of a thin film according to some embodiments of the inventive concepts.

Referring to FIG. 6, a magnetization according to a temperature of the graphene layer doped with manganese fabricated by the above method was measured. As shown in FIG. 6, the magnetization decreases as the temperature increases. In addition, the graphene layer doped with manganese according to the inventive concepts has a curie temperature of about 350K.

Measurement and Analysis of Resistance

FIG. 7 is a graph illustrating a change in resistance according to a temperature of a thin film according to some embodiments of the inventive concepts.

Referring to FIG. 7, resistance values of the graphene layer doped with manganese fabricated by the above method were measured in a temperature range of 150K to 300K.

A resistance of a graphene layer not doped with manganese increases as a temperature increases (see an inner graph of FIG. 7), but the resistance of the graphene layer doped with manganese according to the inventive concepts decreases as the temperature increases, as illustrated in FIG. 7.

In other words, an electrical conductivity characteristic of the graphene layer doped with manganese according to the inventive concepts may be close to a semiconductor property in which an electrical conductivity increases as a temperature increases. A change in resistance of the graphene layer doped with manganese is fitted to the following equation 1 related to an electrical conductivity value of a semiconductor. In addition, band gap energy of the graphene layer doped with manganese was calculated as 165 meV.

$$\sigma = \sigma_0 \exp(-E_g/2kT) \quad \text{[Equation 1]}$$

Analysis of Current-Voltage Characteristic

FIG. 8 is a graph illustrating a current-voltage characteristic of a transistor including a thin film according to some embodiments of the inventive concepts.

Referring to FIG. 8, a field effect transistor was fabricated using the graphene layer doped with manganese fabricated by the above method as an active layer. Gold electrodes having thicknesses of 50 nm and fabricated by an E-beam evaporation method were used as source and drain electrodes of the field effect transistor. The field effect transistor had a channel length of 10 μm and a channel width of 100 μm. A current-voltage characteristic of the field effect transistor was evaluated.

As shown in FIG. 8, the field effect transistor including the graphene layer doped with manganese shows characteristics of a P-type transistor. In addition, a mobility of carries in a channel of the graphene layer doped with manganese was calculated based on current and voltage values of the field effect transistor. As a result, the mobility of the graphene layer doped with manganese was calculated as 2,543 cm$^2$V$^{-1}$S$^{-1}$.

FIG. 9 is a graph illustrating an on/off current ratio of a transistor including a thin film according to some embodiments of the inventive concepts.

Referring to FIG. 9, an on/off current ratio of the field effect transistor fabricated by the method described with reference to FIG. 8 was measured.

As shown in FIG. 9, the on/off current ratio is substantially maintained at about 2.1 in a voltage range of 0V to about 165 mV, and the on/off current ratio is rapidly reduced at a voltage greater than about 165 mV. In addition, band gap energy was calculated as 165 meV.

The thin film doped with the metal (or the graphene layer doped with the transition metal) may be used in various electronic devices such as a spin field effect transistor, a spin valve, and a STT-MRAM device.

According to some embodiments of the inventive concepts, the metal gas generated by the evaporation and the source gas may be provided onto the substrate at the same time. Thus, the thin film doped with the metal may be formed on the substrate. In addition, when the source gas includes carbon, the graphene layer doped with the metal may be formed on the substrate. In this case, the metal may be covalently bonded to carbon of the graphene layer to constitute the honeycomb lattice.

Thus, it is possible to provide the thin film, the method of fabricating the same, and the apparatus for fabricating the same, which can simplify fabricating processes, can reduce the fabricating cost, and can easily adjust the electrical and magnetic characteristics.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An apparatus for fabricating a thin film, the apparatus comprising:
   a tube including one end and another end;
   a first heater supplying heat to a first region, adjacent to the one end, of the tube;
   a second heater supplying heat to a second region, adjacent to the other end, of the tube, the second heater disposed in parallel to the first heater along the tube;
   a gas inlet through which a source gas is supplied to the one end of the tube; and
   a gas outlet through which the source gas comprising carbons is exhausted from the other end of the tube,
   wherein a metal source comprising a transition metal oxide is disposed in the first region and is evaporated by the heat supplied from the first heater to generate a metal gas,
   wherein a substrate is disposed in the second region,
   wherein the generated metal gas and the source gas are provided onto the substrate at the same time to form a thin film doped with a metal of the metal gas on the substrate, and
   wherein the metal in the thin film is covalently bonded to the carbons to form a honeycomb lattice.

2. The apparatus of claim 1,
   wherein a graphene layer doped with the metal is formed on the substrate.

3. The apparatus of claim 1, wherein an internal temperature of the first region and an internal temperature of the second region are adjusted independently of each other by the first heater and the second heater.

4. The apparatus of claim 1, wherein the first heater and the second heater surround the first region and the second region, respectively.

5. A method of fabricating a thin film, the method comprising:
preparing a substrate;
evaporating a metal source comprising a transition metal oxide to generate a metal gas;
forming a graphene layer doped with a metal of the metal gas on the substrate by providing a source gas including carbons and the metal gas onto the substrate at the same time,
wherein the metal in the graphene layer is covalently bonded to the carbons to form a honeycomb lattice.

6. The method of claim 5, wherein the metal is covalently bonded to carbons included in the graphene layer to form a honeycomb lattice comprised of carbon atoms and the metal atoms.

7. The method of claim 5, wherein the evaporating of the metal source and the forming of the graphene layer doped with the metal are performed in the same tube.

8. The method of claim 5, wherein the evaporating of the metal source comprises supplying heat to the metal source, and
wherein a doping concentration of the metal is adjusted by adjusting the heat supplied to the metal source.

9. The apparatus of claim 1, wherein the transition metal oxide wherein the transition metal oxide is at least one selected from the group consisting of molybdenum oxide, titanium oxide, cobalt oxide, nickel oxide, tungsten oxide and manganese oxide.

10. The apparatus of claim 1, wherein the transition metal oxide is manganese oxide.

11. The method of claim 5, wherein the transition metal oxide is at least one selected from the group consisting of molybdenum oxide, titanium oxide, cobalt oxide, nickel oxide, tungsten oxide and manganese oxide.

12. The method of claim 5, wherein the transition metal oxide is manganese oxide.

* * * * *